(12) United States Patent
Holtmannspötter et al.

(10) Patent No.: US 10,094,743 B2
(45) Date of Patent: Oct. 9, 2018

(54) ORDER ANALYSIS SYSTEM

(71) Applicant: epro GmbH, Gonau (DE)

(72) Inventors: Hermann Holtmannspötter, Ochtrup (DE); Matthias Holtmannspötter, Ochtrup (DE); Thomas Wewers, Gronau (DE)

(73) Assignee: epro GmbH, Gronau (DE)

( * ) Notice: Subject to any disclaimer, the term of this patent is extended or adjusted under 35 U.S.C. 154(b) by 263 days.

(21) Appl. No.: 15/069,040

(22) Filed: Mar. 14, 2016

(65) Prior Publication Data
US 2017/0261404 A1    Sep. 14, 2017

(51) Int. Cl.
*G06F 11/30* (2006.01)
*G01M 99/00* (2011.01)
*H03H 17/02* (2006.01)

(52) U.S. Cl.
CPC ...... *G01M 99/005* (2013.01); *H03H 17/0251* (2013.01)

(58) Field of Classification Search
CPC .................................................. G01M 99/005
USPC ......................................................... 702/182
See application file for complete search history.

(56) References Cited

U.S. PATENT DOCUMENTS

| | | |
|---|---|---|
| 6,847,854 B2 | 1/2005 | Discenzo |
| 7,050,873 B1 | 5/2006 | Discenzo |
| 7,308,322 B1 | 12/2007 | Discenzo et al. |
| 7,539,549 B1 | 5/2009 | Discenzo et al. |
| 7,797,062 B2 | 9/2010 | Discenzo et al. |
| 8,126,574 B2 | 2/2012 | Discenzo et al. |
| 8,417,360 B2 | 4/2013 | Sustaeta et al. |
| 8,914,300 B2 | 12/2014 | Sustaeta et al. |
| 2004/0267395 A1* | 12/2004 | Discenzo ............. G05B 13/024 700/99 |

OTHER PUBLICATIONS

"System Manual MMS 6000, Operating Manual, Shaft Vibration Monitor MMS 6110," epro GmbH, Jöbkesweg 3, D-48599 Gronau, Germany, Sep. 12, 2007.

* cited by examiner

*Primary Examiner* — Anthony Ho
(74) *Attorney, Agent, or Firm* — Luedeka Neely Group, P.C.; Rick Barnes

(57) ABSTRACT

An instrument for performing order analysis on a rotational machine. An input module receives periodic motion data, and machine characteristic data that is associated by time with the periodic motion data. A processor module receives the periodic motion data and the machine characteristic data, applies a Goertzel module to the periodic motion data and the machine characteristic data, and thereby creates an order data set comprising magnitude of machine characteristic data versus order of normalized periodic motion data.

4 Claims, 7 Drawing Sheets

ORDER ANALYSIS SYSTEM

FIELD

This invention relates to the field of machine health, protection, and prediction. More particularly, this invention relates to order analysis for detecting machine condition.

INTRODUCTION

Order analysis is used to analyze information, such as sound and vibration signals, that is gathered from equipment that has periodic movement. This includes rotating machine, such as turbines, motors, pumps, compressors, and so forth. It also includes machines repetitively move in some other periodically repeating manner, but which is not rotational, such as a box-folding machine. All such are generally referred to herein as machines.

An "order," as used in the term "order analysis," is the frequency at which the machine is making its periodically repeating motion, such as rotating, normalized to a value of one. Thus, in one embodiment, the first order is merely the periodic motion, and additional orders are multiples of the periodic motion. The various orders are thus the harmonics of the periodic motion. Although it has been explained that these concepts apply to more than just rotating machines, the various descriptions provided herein will be given in regard to rotating machines, so as to not unduly encumber the language.

Generally speaking then, order analysis is useful to determine the relationships that exist between the periodic motion and machine information, such as sound and vibration. Using order analysis, one can identify and isolate such sound and vibration patterns, and thereby determine a status of individual components of the machine.

Many mechanical characteristics of machinery change with the periodic motion of the machine. Some mechanical conditions, such as resonance, can typically only be observed as the periodic motion approaches or passes the resonant speed. Thus, machine sound and vibration tests usually require a run-up or run-down test. Order analysis techniques enable one to analyze sound and vibration signals not only when the machine is operating at a steady periodic motion, but also when the periodic motion changes over time, by continually normalizing the periodic motion of the machine.

Order analysis can be used to determine both the magnitude and phase of the sound and vibration data, for not only the base frequency but also the harmonics or higher orders of the signal. This information is useful to determine machine state. For example, an increase in the periodic motion frequency magnitude indicates an unbalance situation. Harmonics of the periodic motion frequency indicate other errors, such as misalignment.

What is needed, therefore, is a system that more information in regard to the issues described above, at least in part.

SUMMARY

The above and other needs are met by an instrument for performing order analysis on a machine. An input module receives periodic motion data, and machine characteristic data that is associated by time with the periodic motion data. A processor module receives the periodic motion data and the machine characteristic data, applies a Goertzel module to the periodic motion data and the machine characteristic data, and thereby creates an order data set comprising magnitude of machine characteristic data versus order of normalized periodic motion data.

In various embodiments, the machine characteristic data includes vibrational data. In some embodiments, the machine characteristic data includes sound data. In some embodiments, the order data set further includes phase of machine characteristic data. Some embodiments include a display for presenting a representation of the order data set. In some embodiments, the representation of the order data set includes a graph of magnitude of machine characteristic data versus normalized periodic motion data.

According to another aspect of the invention there is described a method for performing order analysis on a machine. Periodic motion data is received, along with machine characteristic data that is associated by time with the periodic motion data. A Goertzel module is applied to the periodic motion data and the machine characteristic data, thereby creating an order data set comprising magnitude of machine characteristic data versus order of normalized periodic motion data.

According to yet another aspect of the invention there is described a non-transient, computer-readable medium containing a program for enabling a computer to perform order analysis on a rotational machine, by causing a processor of the computer to perform the following steps. Periodic motion data is received, along with machine characteristic data that is associated by time with the periodic motion data. A Goertzel module is applied to the periodic motion data and the machine characteristic data, thereby creating an order data set comprising magnitude of machine characteristic data versus order of normalized periodic motion data.

DRAWINGS

Further advantages of the invention are apparent by reference to the detailed description when considered in conjunction with the figures, which are not to scale so as to more clearly show the details, wherein like reference numbers indicate like elements throughout the several views, and wherein.

DESCRIPTION

Figure 1:
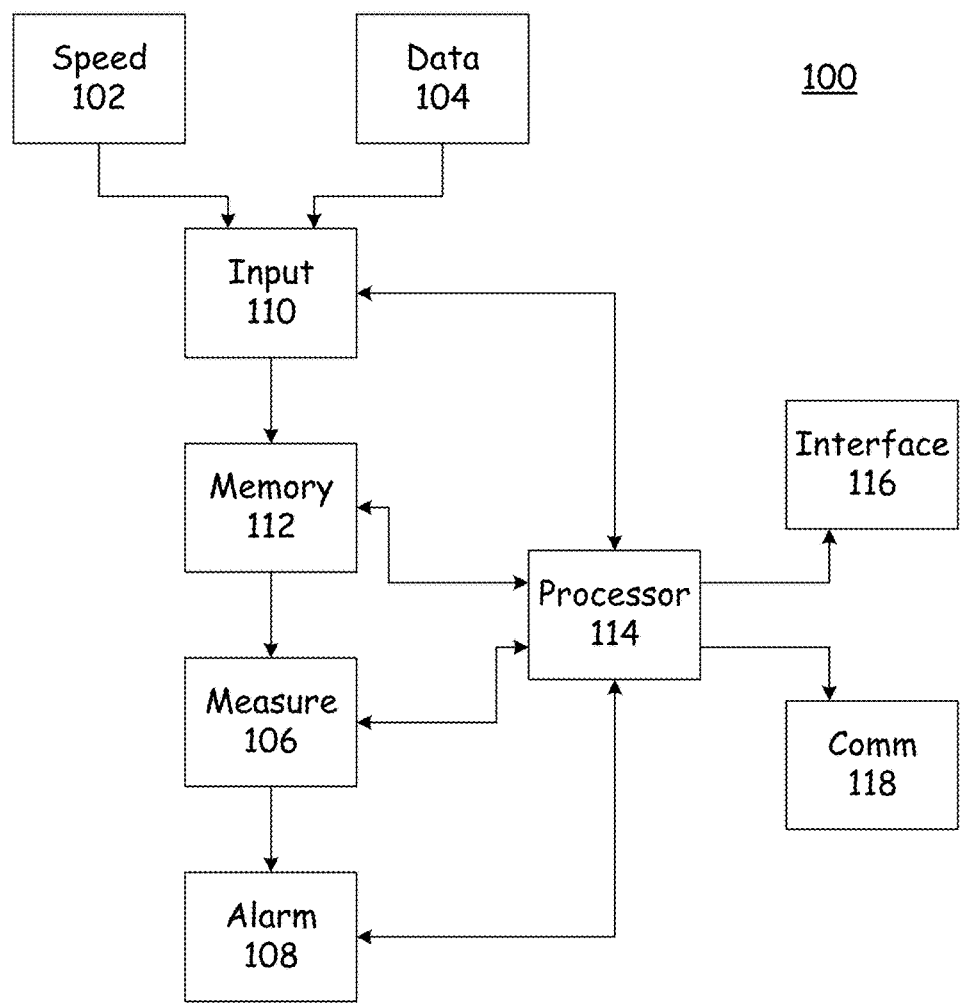
FIG. 1 is a functional block diagram of an order analysis system according to an embodiment of the present invention.

With reference now to FIG. 1 there is depicted a functional block diagram of an order analysis system 100 according to an embodiment of the present invention, including a speed detection module 102, a data sensing module 104, an input 110, a memory 112, a measurement module 106, an alarm module 108, and a processor 114.

As used herein, the term "module" includes both hardware and software components. In some embodiments, the module is a custom piece of hardware with software embodied in firmware that is either not changeable or not readily changeable. In other embodiments the module is implemented predominantly in software that runs on general purpose computing system hardware. Some modules, as described below, always include special purpose hardware, such as sensors of various kinds, which are not typically included in general purpose computing system hardware.

As introduced above, in some embodiments the order analysis system 100 is implemented in customized hardware. In alternate embodiments, the order analysis system 100 is implemented primarily in software that runs on a general purpose computing platform, with specialized equipment, as needed, to provide the speed and data sensing information.

The speed detection module 102 uses speed information given by an external input for speed evaluation. Some embodiments include an external trigger input or a direct sensor input, such as a tachometer. In some embodiments the speed information is received as a digital signal, and in other embodiments the speed information is received as an analog signal and converted into a digital signal, such as by the speed detection module 102.

The data acquisition module 104 samples data from a sensor or raw signal sources, such as for sound data or vibration data. In some embodiments it converts an analog signal to a digital signal, if the data is not already provided in the digital domain. Subsequent processing of the sampled data is then accomplished in the digital domain. In some embodiments, preprocessing of some sort is performed on the data signal, as described in more detail hereafter.

The speed and machine data are received such as through an input 110, which in various embodiments takes the form of one or more of a USB, serial, parallel, or proprietary input. The data received from the periodic motion module 102 and the machine data module 104 is stored in a memory 112, at least temporarily. For example, if post processing is to be performed on the data, then the memory 112 could hold the data for quite some time. However, if real time analysis is to be performed on the data, then it might just be buffered in the memory 112.

The measurement module 106 receives the periodic motion data 110 from the memory 112, or in some embodiments, directly through the input 110 from the speed module 102 and the machine data module 104. The measurement module 106 uses the periodic motion information 110 (which could be rotation) to perform a selective frequency extraction from the measured vibration input signal 112. The different components (magnitude and phase) of the machine data signal 112 can be monitored directly or combined in various ways to produce new information.

The monitoring and alarming module 108 monitors the output of the measurement module 106, and compares the output to various standards and limits. When any of the standards or limits are violated, the alarm module 108 brings notice of such to a system operator, or otherwise outputs a signal with an indication of the particular violation, so that action can be taken in regard to the violation. In some embodiments the action is automatically implemented, and in other embodiments the action is manually implemented.

The system 100 is generally under the control of the processor 114. Also present in some embodiments of the system 100 is a user interface 116, and a communication module 118, such a network communication interface for communication between the system 100 and other computing systems.

Figure 2:
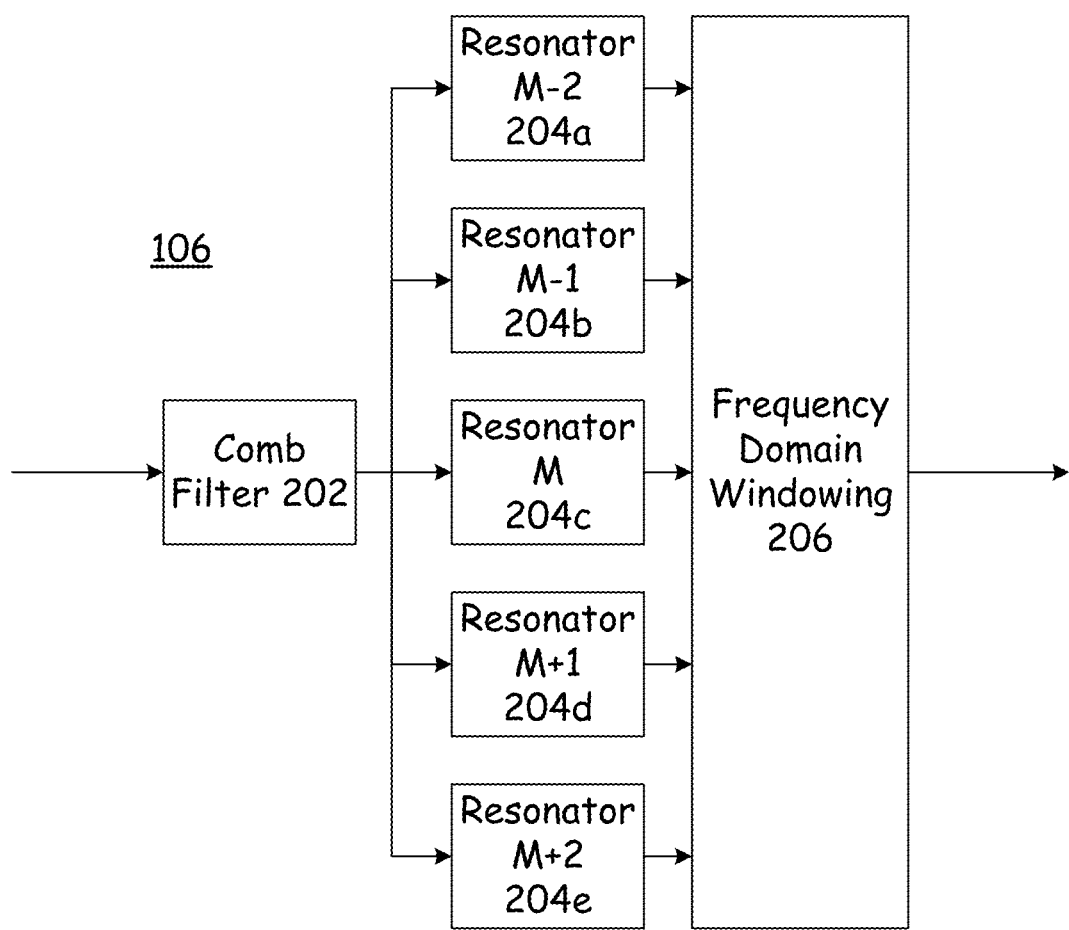
FIG. 2 is a functional block diagram of a Goertzel module according to an embodiment of the present invention.

With reference now to FIG. 2, there is depicted a more detailed embodiment of the measuring module 106, which is used to describe the signal processing that in one embodiment is used to detect the amplitudes and phases of the periodic motion frequencies and its harmonics and sub harmonics.

The embodiment depicted in FIG. 2 implements a Goertzel module. The specific module depicted in FIG. 2 is a sliding or modified Goertzel module. In the present embodiment, the parameter settings of the Goertzel module 106 are continuously updated so as to adapt to new periodic motion frequencies, which is especially beneficial during machine ramp up and ramp down.

Figure 3:
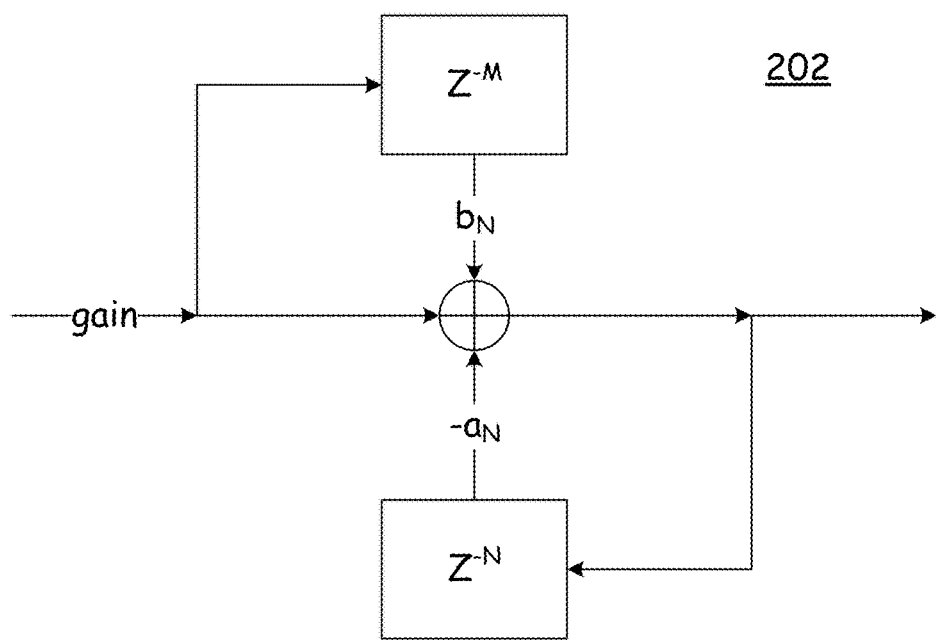
FIG. 3 is a functional block diagram of a comb filter module according to an embodiment of the present invention.

The Goertzel module 106 as depicted in FIG. 2 includes a comb filter 202, a plurality of resonator blocks 204, and a time domain windowing module 206. In some embodiments, the comb filter 202 is implemented as depicted in FIG. 3. The comb filter 202 is applied in the time domain. The resonator blocks 204 then convert the time signal to the frequency domain, and the windowing 206 is performed in the frequency domain, instead of doing the windowing filtering in the time domain.

In some embodiments the filter 202 has a transfer function of:

$$H(z) = \text{gain}\left[\frac{(1 + b_n * Z^{-M})}{(1 - a_n * Z^{-N})}\right].$$

Figure 4:
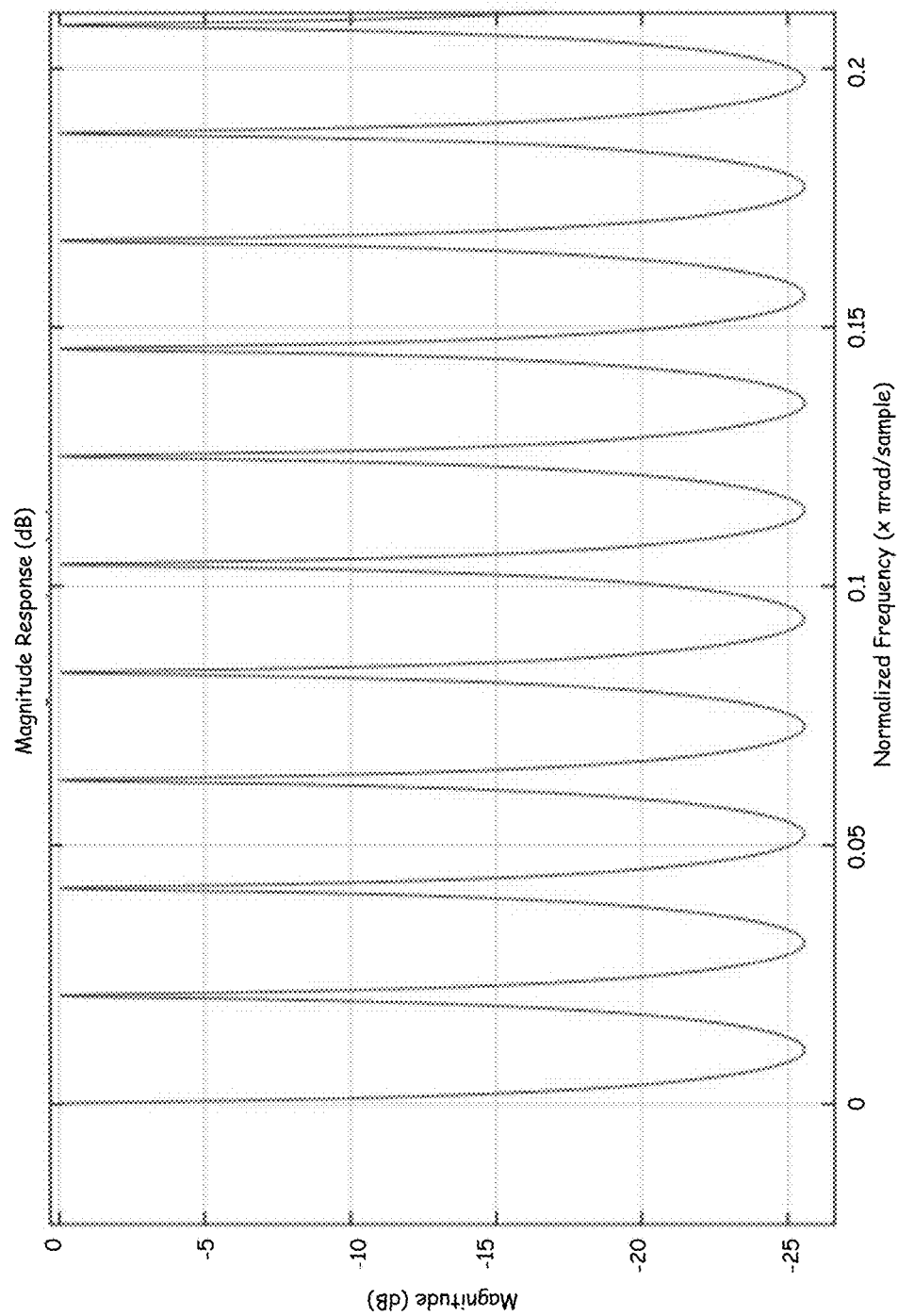
FIG. 4 is a graph of a frequency selective setting for the comb filter module according to an embodiment of the present invention.
Figure 5:
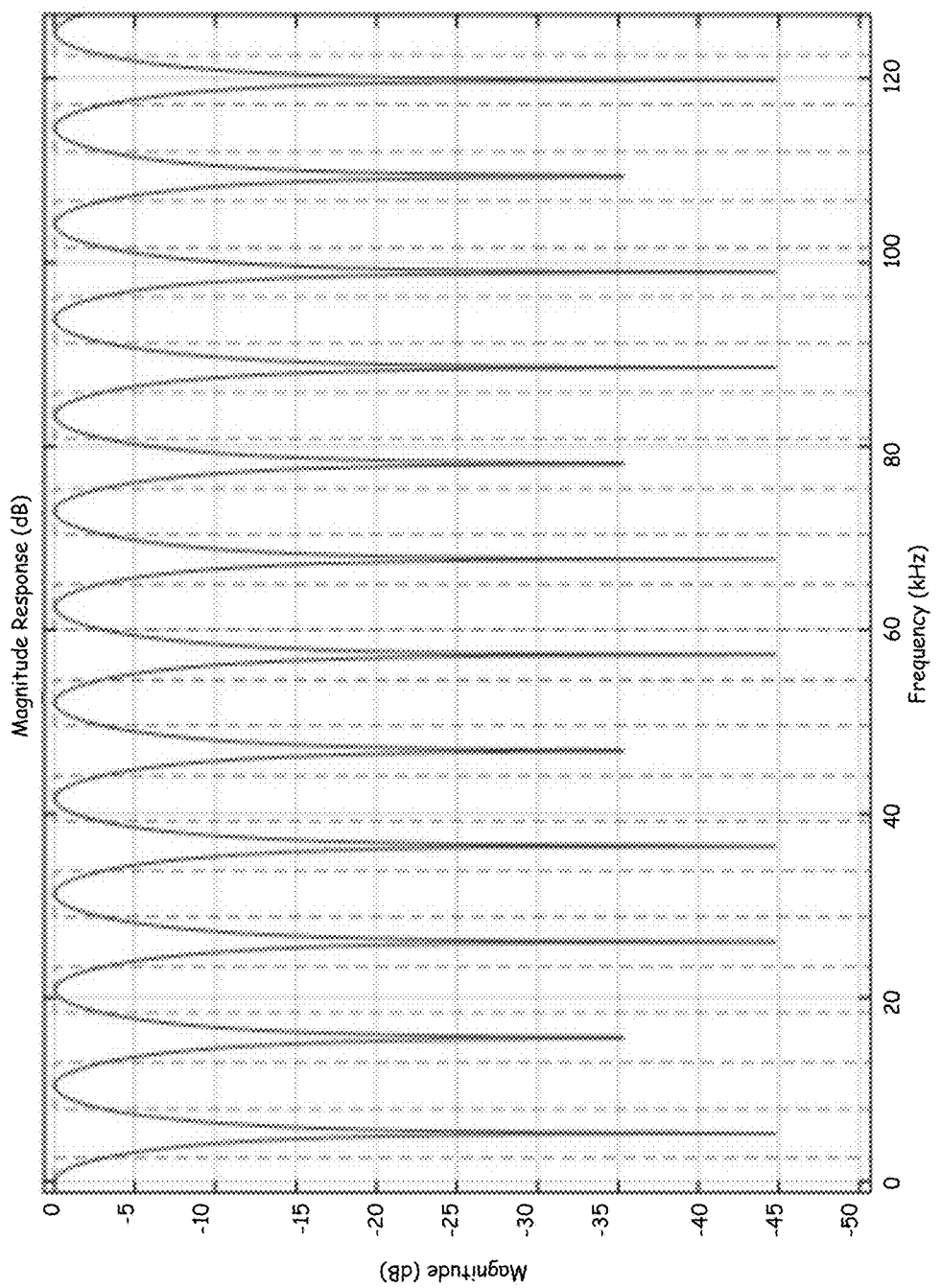
FIG. 5 is a graph of a harmonic bandwidth selective setting for the comb filter module according to an embodiment of the present invention.

The filter 202 is not present in some embodiments, but in other embodiments it is set to be very frequency selective, as depicted in FIG. 4. In other embodiments the filter 202 is set so as to provide a specific bandwidth around the harmonics to be detected, as depicted in FIG. 5. Various embodiments according to the present invention use different types of comb filter 202 according to the needs of the measurement. For highly selective frequency extraction the comb filter 202, in some embodiments, is set to the notch characteristic as depicted in FIG. 4. For band limited extraction with a larger number of windowing filters for sidebands, the comb filter 202, in some embodiments, is set for band limiting, as depicted in FIG. 5.

As depicted in FIG. 2, each resonator block 204 extracts a single frequency bin from an input signal coming from the comb filter 202, if present. The resonator blocks 204 provide periodic motion frequency functionality, which is the starting point of an order analysis. The number of resonator blocks 204 needed for a single harmonic detection depends, in some embodiments, on the number of averages in frequency domain to be executed. In the embodiment as depicted in FIG. 2, five resonator blocks 204 are shown, but in other embodiments a different number of resonator blocks 204 could be implemented. After each measurement (where the number of measurement samples is configurable in some embodiments), new coefficients are calculated for the resonator blocks 204. At any time that new data is available, the evaluation output is synchronized to the measurement cycles.

Figure 6:
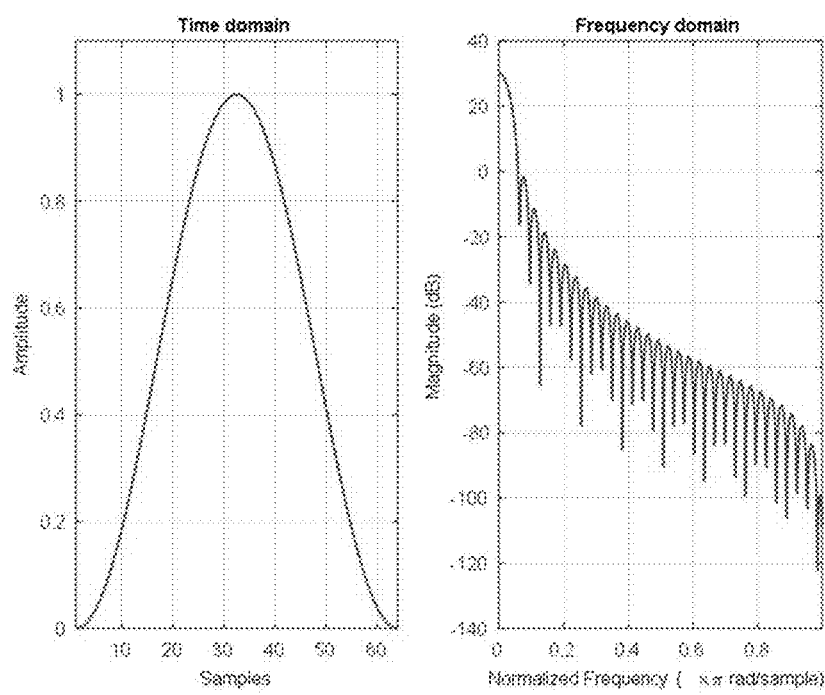
FIG. 6 is a graph of a time domain depiction and a frequency domain depiction of the application of a Hanning filter module according to an embodiment of the present invention.

In some embodiments, the windowing functionality 206 is accomplished in the frequency domain by cosine filters, such as the Hanning filter depicted in FIG. 6. Embodiments of the present invention, use the windowing function 206 for weighing the output from some number of resonator blocks 204. This includes sideband bins in the result of the order analysis. For high speed gradients, this architecture helps to assure that the input data is in the observer range of the Goertzel module 106.

Various embodiments according to the present invention use a single Goertzel module 106 for each speed base or harmonic frequency part extraction. In such embodiments, each Goertzel module 106 can be independently configured or configured as a group.

Thus, various embodiments of the present invention employ a Goertzel module 106 in the frequency domain for order analysis, such as in a protection and prediction system for rotating machines. By using the Goertzel module 106, the resonator 204, comb filter 202, and window 206 parameters can be updated continuously to support fast and precise magnitude and phase information. Further, fast Fourier transforms use block processing, whereas a Goertzel module 106 only needs a flexible delay line, if a comb filter 202 is used.

Figure 7:
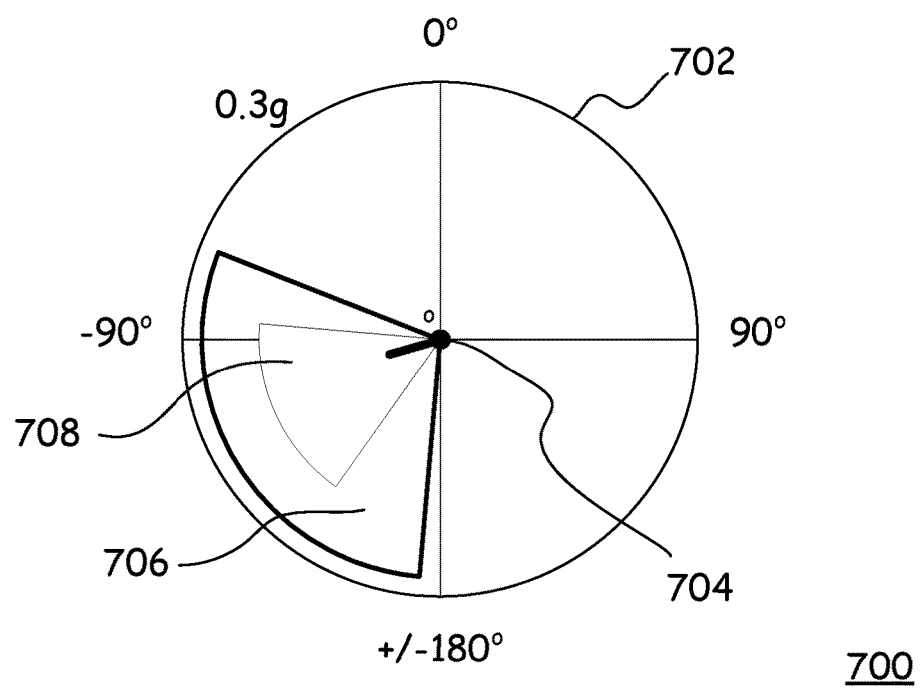
FIG. 7 is a graph of the magnitude and phase of an order of a periodic motion data set, with regions for alert and danger sections according to an embodiment of the present invention.

With reference now to FIG. 7 there is depicted a graph 700 of the magnitude and phase of an order of a periodic motion data set, with regions for alert and danger sections according to an embodiment of the present invention. As can be seen in FIG. 7, the graph includes a circle 702 representing 360 degrees of rotation of an element of the machine, a directional indicator 704 at the center of the circle 702 representing a thrust vector, a first wedge 706 disposed within the circle 702 representing a safe operation zone for the machine, and a second wedge 708 disposed within the circle 702 representing the violation of at least one of the standard and the limit.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. An instrument for performing order analysis on a machine, the instrument comprising:

a speed detection module for detecting a speed of a periodically moving member of a machine and providing a speed signal, a sensing module for detecting at least one of sound and vibration and providing a machine signal, an input module for receiving the speed signal and the machine signal, a memory for holding the speed signal as speed data and the machine signal as machine data, a measurement module comprising a Goertzel module for using the speed data to perform a selective frequency extraction from the machine data and providing an order data set, an alarm module for receiving the order data set and comparing the order data set to at least one of a standard and a limit, and when at least one of the standard and limit is violated, outputting a signal with an indication of the violation, a user interface comprising a display for presenting information to a user, a communication module for communicating between the instrument and other computing systems, and a processor module for, controlling the measurement module to apply the Goertzel module to the speed data and the machine data, creating from the order data set at least one of a polar representation and a complex representation of machine data versus order of normalized periodic motion data, and presenting the polar representation to the user as a graph on the display, the graph including magnitude and phase of an order of the periodic motion data, with regions for alert and danger sections.

2. The instrument of claim 1, wherein the polar representation comprises a circle representing 360 degrees of rotation of an element of the machine, a directional indicator at the center of the circle representing a thrust vector, a first wedge disposed within the circle representing a safe operation zone for the machine, and a second wedge disposed within the circle representing violation of at least one of the standard and the limit.

3. The instrument of claim 1, wherein the complex representation of the order data set comprises at least one of real and imaginary parts of machine characteristic data.

4. The instrument of claim 1, wherein the representation of the order data set comprises a graph of magnitude of machine characteristic data versus normalized periodic motion data.

* * * * *